United States Patent
Wang

(10) Patent No.: US 7,368,298 B2
(45) Date of Patent: May 6, 2008

(54) METHOD OF MANUFACTURING FERROELECTRIC SEMICONDUCTOR DEVICE

(75) Inventor: Wensheng Wang, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 335 days.

(21) Appl. No.: 10/835,436

(22) Filed: Apr. 30, 2004

(65) Prior Publication Data

US 2005/0136555 A1 Jun. 23, 2005

(30) Foreign Application Priority Data

Dec. 22, 2003 (JP) .............................. 2003-425784

(51) Int. Cl.
*H01L 21/8242* (2006.01)
(52) U.S. Cl. .................. 438/3; 438/240; 257/E27.104; 257/E21.208; 257/E21.663; 257/E21.664
(58) Field of Classification Search .................... 438/3, 438/240, 396–399; 257/E27.104, E21.208, 257/E21.663, E21.664
See application file for complete search history.

(56) References Cited

U.S. PATENT DOCUMENTS

| | | | | |
|---|---|---|---|---|
| 5,116,643 A | * | 5/1992 | Miller et al. ............. | 427/126.3 |
| 6,495,413 B2 | * | 12/2002 | Sun et al. .................... | 438/240 |
| 6,509,601 B1 | * | 1/2003 | Lee et al. .................... | 257/310 |
| 6,815,226 B2 | * | 11/2004 | Lee et al. ....................... | 438/3 |
| 6,887,716 B2 | * | 5/2005 | Fox et al. ....................... | 438/3 |
| 2003/0234411 A1 | * | 12/2003 | Kanaya et al. .............. | 257/295 |
| 2004/0005724 A1 | * | 1/2004 | Lee et al. ....................... | 438/3 |
| 2004/0043517 A1 | * | 3/2004 | Sashida ......................... | 438/3 |
| 2004/0046185 A1 | * | 3/2004 | Sashida ...................... | 257/200 |
| 2004/0084701 A1 | * | 5/2004 | Kanaya et al. .............. | 257/295 |

OTHER PUBLICATIONS

Patent Abstracts of Japan, Publication No. 11054718, dated Feb. 26, 1999.
Patent Abstracts of Japan, Publication No. 2003017664, dated Jan. 17, 2003.

* cited by examiner

*Primary Examiner*—George Fourson
(74) *Attorney, Agent, or Firm*—Westerman, Hattori, Daniels & Adrian, LLP.

(57) ABSTRACT

An Ir film, an $IrO_x$ film, a Pt film, a PtO film and a Pt film are formed, and thereafter a PLZT film is formed. Then, heat treatment at 600° C. or lower is performed by the RTA method in an atmosphere containing Ar and $O_2$ to thereby crystallize the PLZT film. Subsequently, an $IrO_x$ film and an $IrO_2$ film are formed. Then, these films are patterned at once. Thereafter, an alumina film is formed as a protective film. Subsequently, heat treatment at 650° C. for 60 minutes in an oxygen atmosphere is performed as recovery annealing. Note that no heat treatment is performed from the crystallization of the PLZT film to the recovery annealing.

19 Claims, 16 Drawing Sheets

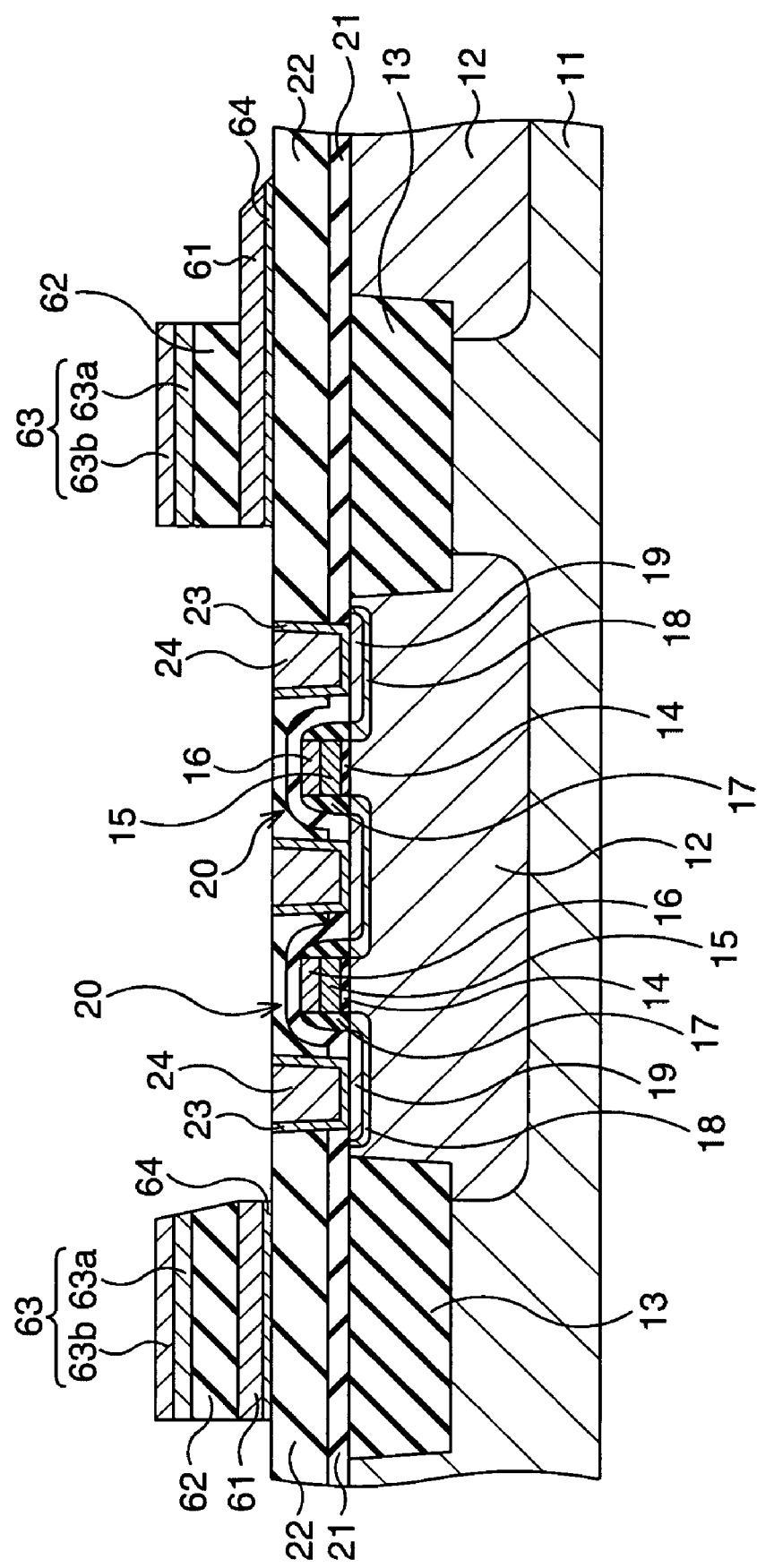

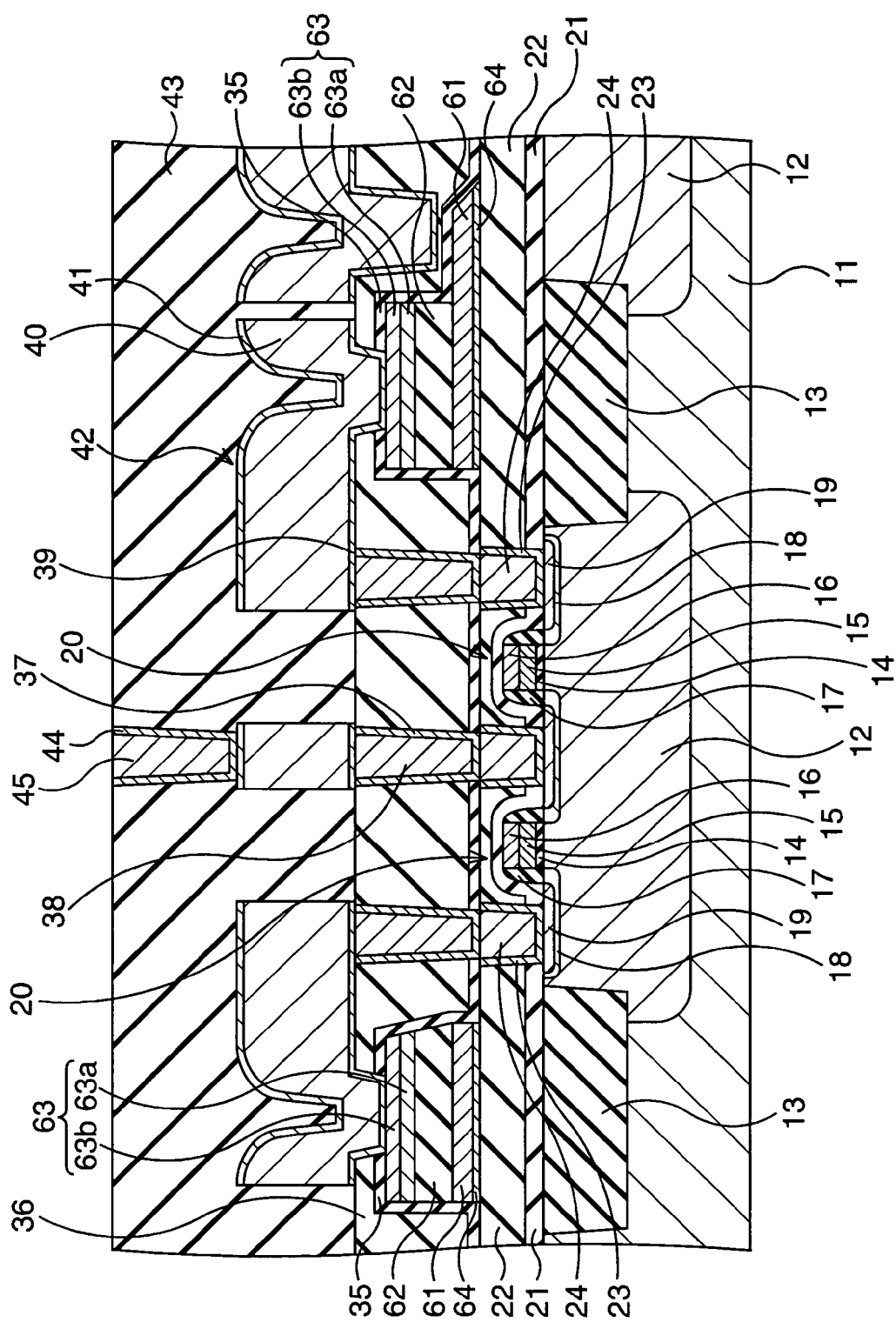

METHOD OF MANUFACTURING FERROELECTRIC SEMICONDUCTOR DEVICE

CROSS-REFERENCE TO RELATED APPLICATIONS

This application is based upon and claims the benefit of priority from the prior Japanese Patent Application No. 2003-425784, filed on Dec. 22, 2003, the entire contents of which are incorporated herein by reference.

BACKGROUND OF THE INVENTION

1. Field of the Invention

The present invention relates to a method of manufacturing a semiconductor device suitable for a ferroelectric memory.

2. Description of the Related Art

In recent years, there are increasing tendencies to process or save a large capacity of data at a high speed with progression of the digital technique. Therefore, there is a demand for high integration and high performance of semiconductor devices for use in electronic equipment.

Hence, on a semiconductor memory, a technique has begun to be extensively researched and developed that uses a ferroelectric material or high dielectric constant material in place of silicon oxide or silicon nitride in the prior art as a capacity insulation film of capacitor elements constituting a DRAM to realize, for example, high integration of the DRAM.

Further, a technique using a ferroelectric film having spontaneous polarization characteristics as the capacity insulation film has also begun to be researched and developed to realize a non-volatile RAM capable of write operation and read operation at a lower voltage and a higher speed. Such a semiconductor memory is called a ferroelectric memory (FeRAM).

The FeRAM stores information through use of hysteresis characteristics of a ferroelectric. The ferroelectric memory includes ferroelectric capacitors, the ferroelectric capacitor having a ferroelectric film, as a capacitor dielectric film, sandwiched between a pair of electrodes. The ferroelectric film generates polarization in accordance with the voltage applied between the electrodes and has spontaneous polarization even after the applied voltage is removed. Further, when the polarity of the applied voltage is reversed, the polarity of the spontaneous polarization is also reversed. Accordingly, by detecting the spontaneous polarization, the information can be read. The FeRAM can operate at a low voltage and be written to with reduced power and at a high speed, as compared to a flash memory.

Used as the ferroelectric film of the FeRAM are PZT based materials such as lead zirconate titanate (PZT), La doped PZT (PLZT) and so on, and Bi layer structure compounds such as $SrBi_2Ta_2O_9$ (SBT, Y1), $SrBi_2(Ta, Nb)_2O_9$ (SBTN, YZ) and so on. These films are formed on a lower electrode film by a sol-gel method, a sputtering method, an MOCVD method, or the like. However, the films right after the formation are in an amorphous phase. Therefore, the films are transformed in phase into crystals of the perovskite structure by heat treatment thereafter. After the formation of the ferroelectric film, an upper electrode film is formed thereon. In this event, the ferroelectric film receives physical damage mainly by sputtering particles with high energy. As a result of this, part of the crystal structure of the ferroelectric film is broken to cause characteristic degradation of the capacitor element.

Hence, conventionally, the capacitor element is recovered from the characteristic degradation by the following processing. First, after patterning of the upper electrode film, heat treatment is performed in an oxygen atmosphere to thereby recover the crystallinity of the ferroelectric film. Then, after patterning of the ferroelectric film, an aluminum oxide film is formed as a protective film to cover the ferroelectric film in order to prevent hydrogen-induced degradation. Also during the patterning of the ferroelectric film and the formation of the protective film, damage occurs in the ferroelectric film. Therefore, after the formation of the protective film, heat treatment in the oxygen atmosphere is performed again to thereby recover the characteristics. Further, after patterning of the lower electrode film, an aluminum oxide film is formed again as a protective film. Then, heat treatment is performed and an interlayer insulation film is formed.

In the method, however, since a plurality of times of heat treatments are performed, mutual diffusion is apt to occur between the upper electrode (film) and the lower electrode (film) and the ferroelectric film, and thus the ferroelectric film included in the ferroelectric capacitor constituting a cell array is susceptible to defects. When the ferroelectric film is composed of a PLZT film and the upper electrode film is composed of an Ir film or $IrO_x$ film, Pb in the PLZT film is apt to remove. In particular, Pb loss is apt to occur after the patterning of the upper electrode, and Ir excessively diffuses from the upper electrode to the PLZT film. As a result of these, the composition in the films of the cell array becomes nonuniform, leading to a reduction in the switching charge amount or a tendency of degradation in process. Further, imprint is more apt to occur.

In addition to the above-described manufacturing method, various kinds of methods to improve the characteristics of the ferroelectric capacitor have been proposed.

In a method described in Patent Document 1 (Japanese Patent Application Laid-Open No. 2003-17664), an upper electrode film, a ferroelectric film, and a lower electrode film are patterned to form a capacitor element, and then an aluminum oxide film containing impurities removable by heat treatment is deposited to cover at least the capacitor element. Then, heat treatment at 800° C. for one minute is performed in an oxidizing gas atmosphere by an RTA (Rapid Thermal Annealing) method to thereby recover a capacity insulation film from damage and remove the impurities contained in the aluminum oxide layer. Thereafter, heat treatment is performed in a hydrogen atmosphere.

In a method described in Patent Document 2 (Japanese Patent Application Laid-Open No. Hei 11-54718), a capacitor element is formed and then a buffer film composed of a metal oxide film for preventing interaction between a ferroelectric film and an interlayer insulation film is formed. Thereafter, an interlayer insulation film is formed. As the buffer film, a film is used that is stabilized by a low-temperature treatment at 600° C. or lower.

However, in the method described in Patent Document 1, it is impossible to completely recover from the damage caused during the formation of the upper electrode film even by the heat treatment by the RTA method. In addition, it is conceivable that since the annealing is performed at 800° C., Ir excessively diffuses to PLZT to reduce the switching charge amount and increase the leak current.

Besides, in the method described in Patent Document 2, the metal oxide film stabilized by the low-temperature treatment at 600° C. or lower becomes the buffer film, but it is impossible to completely recover the capacitor from the damage.

SUMMARY OF THE INVENTION

It is an object of the present invention to provide a method of manufacturing a semiconductor device capable of suppressing removal and mutual diffusion of constituent elements of a ferroelectric film.

As a result of earnest studies to solve the above problems, the present inventor has devised various aspects described below.

In a method of manufacturing a semiconductor device according to the present invention, a ferroelectric capacitor including a lower electrode, a crystallized ferroelectric film, and an upper electrode is formed, and thereafter an aluminum oxide film covering the ferroelectric capacitor is formed. Then, annealing of the crystallized ferroelectric film is performed in an oxidizing gas atmosphere. However, no heat treatment is performed from the step of forming a crystallized ferroelectric film to the step of performing annealing of the ferroelectric film.

In the present invention, by the annealing in the oxidizing gas atmosphere, the ferroelectric film recovers from the damage received until then. Besides, no heat treatment is performed from the step of forming the crystallized ferroelectric film to the step of performing annealing after the formation of the aluminum oxide film, and the ferroelectric capacitor is covered with the aluminum oxide film during the annealing after the formation of the aluminum oxide film. Thus, removal and mutual diffusion between the ferroelectric film and the upper electrode and the lower electrode of constituent elements of the ferroelectric film are suppressed.

BRIEF DESCRIPTION OF THE DRAWINGS

FIG. 3A to FIG. 3B are a cross-sectional views showing, in the order of steps, a method of manufacturing a ferroelectric memory according to a second embodiment of the present invention;

DETAILED DESCRIPTION OF THE PREFERRED EMBODIMENTS

Figure 1:
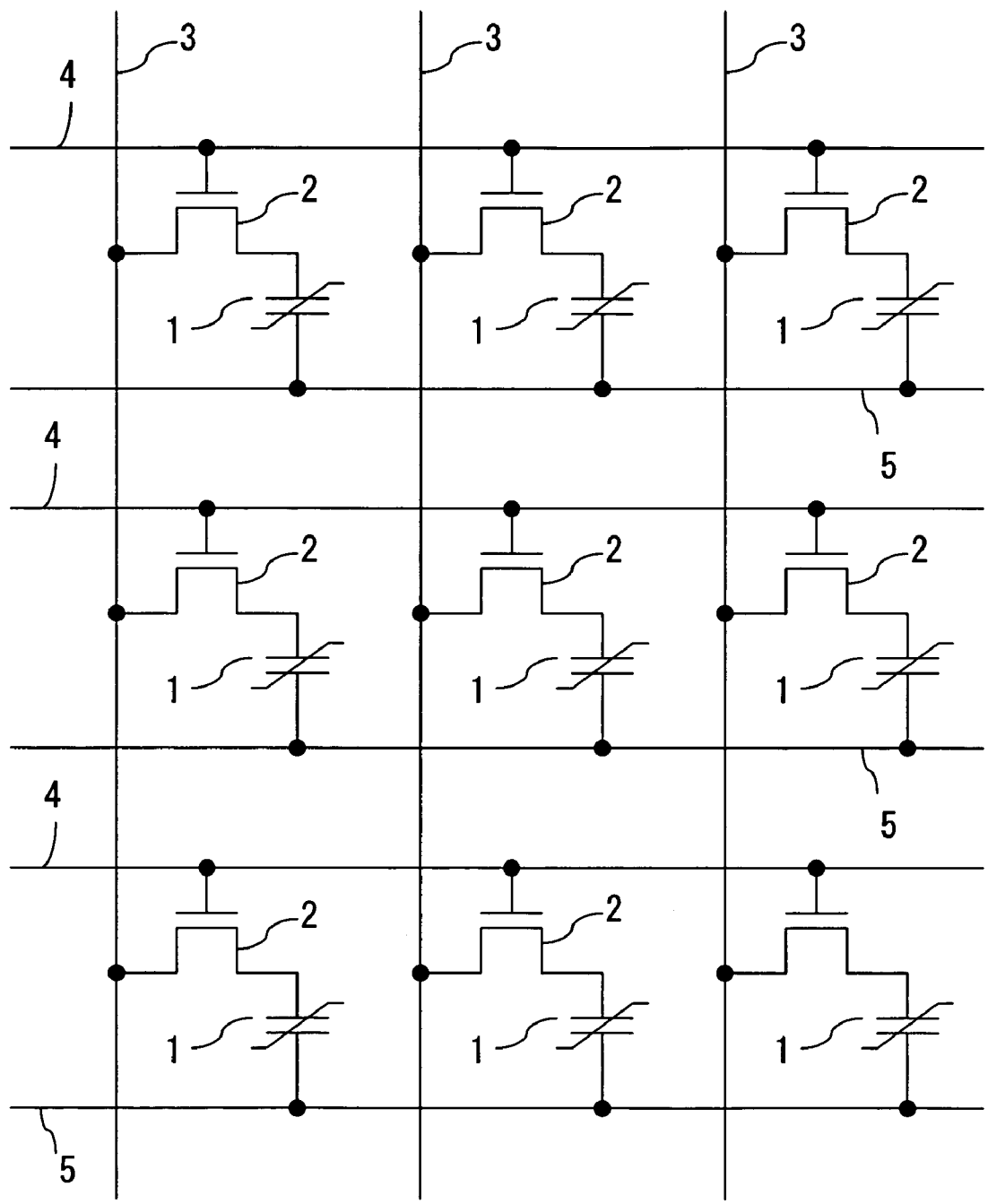
FIG. 1 is a circuit diagram showing a configuration of a memory cell array of a ferroelectric memory manufactured by a method according to an embodiment of the present invention.

Hereinafter, preferred embodiments of the present invention will be specifically described with reference to the accompanying drawings. FIG. 1 is a circuit diagram showing a configuration of a memory cell array of a ferroelectric memory (semiconductor device) manufactured by a method according to an embodiment of the present invention.

This memory cell array is provided with a plurality of bit lines 3 extending in one direction and a plurality of words lines 4 and plate lines 5 extending in a direction perpendicular to a direction in which the bit lines 3 extend. Further, in a manner to match the grid constituted of these bit lines 3, word lines 4, and plate lines 5, a plurality of memory cells of a ferroelectric memory are arranged in an array form. In each memory cell, a ferroelectric capacitor 1 and a MOS transistor 2 are provided.

The gate of the MOS transistor 2 is connected to the word line 4. Further, one source/drain of the MOS transistor 2 is connected to the bit line 3 and the other source/drain is connected to one of electrodes of the ferroelectric capacitor 1. Furthermore, the other electrode of the ferroelectric capacitor 1 is connected to the plate line 5. Note that each of the word lines 4 and plate lines 5 is shared by a plurality of MOS transistors 2 arranged side by side in the same direction as the direction in which the word line 4 and plate line 5 extend. Similarly, each of the bit lines 3 is shared by a plurality of MOS transistors 2 arranged side by side in the same direction as the direction in which the bit line 3 extends. The direction in which the word line 4 and plate line 5 extend and the direction in which the bit line 3 extends may be called a row direction and a column direction, respectively.

In the memory cell array of the ferroelectric memory thus configured, data is stored in accordance with the polarization state of a ferroelectric film provided in the ferroelectric capacitor 1.

First Embodiment

Next, a first embodiment of the present invention will be described. FIG. 2A to FIG. 2D are cross-sectional views showing, in the order of steps, a method of manufacturing a ferroelectric memory (semiconductor device) according to the first embodiment of the present invention. However, FIG. 2A to FIG. 2D show the cross section perpendicular to the direction in which the bit line 3 extends. Further, FIG. 2A to FIG. 2D show a portion corresponding to two MOS transistors sharing one bit line (corresponding to the bit line 3 in FIG. 1).

Figure 2A:
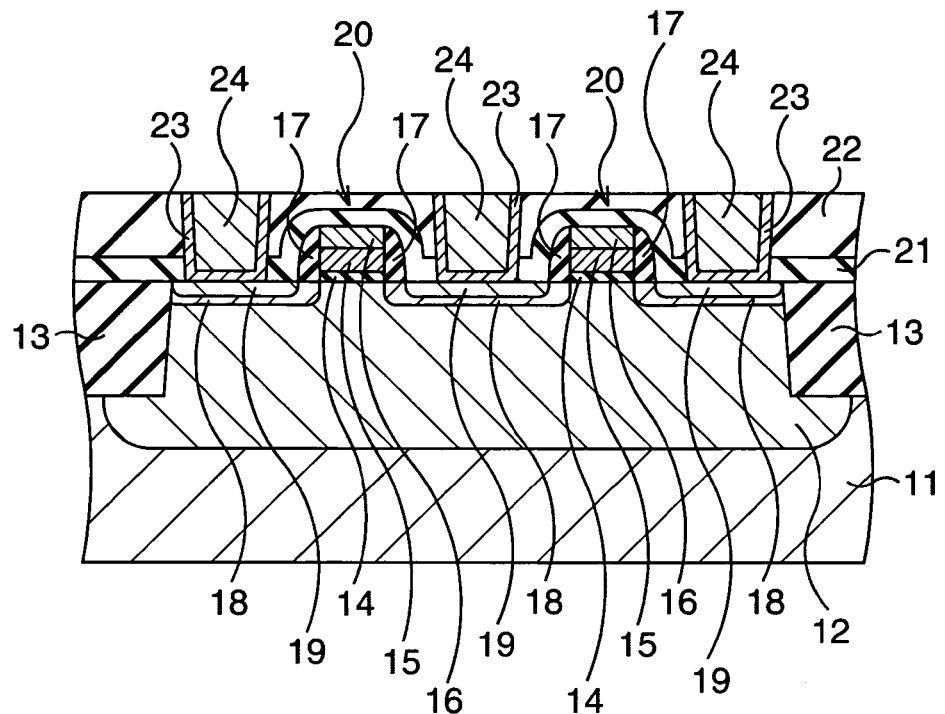
FIG. 2A to FIG. 2D are cross-sectional views showing, in the order of steps, a method of manufacturing a ferroelectric memory according to a first embodiment of the present invention.

In the first embodiment, as shown in FIG. 2A, a well 12 is first formed in the surface of a semiconductor substrate 11 such as a silicon substrate. Then, in the surface of the semiconductor substrate 11, element isolation regions 13 are formed, for example, by an STI (shallow trench isolation) Subsequently, gate insulation films 14, gate electrodes 15, cap films 16, side walls 17, source/drain diffusion layers 18, and silicide layers 19 are formed on the surface of the well 12 to thereby form MOS transistors 20 as switching elements. The MOS transistors 20 correspond to the MOS transistors 2 in FIG. 1. Note that two source/drain diffusion layers 18 are formed for a source and a drain in each of the MOS transistors 20, and one of them is shared by the two MOS transistors 20.

Next, a silicon oxynitride film 21 (thickness: 200 nm) is formed on the entire surface to cover the MOS transistors 20, and a $SiO_2$ film 22 (thickness: 1000 nm) as an interlayer insulation film is further formed on the entire surface and the $SiO_2$ film 22 is planarized by CMP (chemical mechanical polishing) or the like. The silicon oxynitride film 21 is formed to prevent hydrogen-induced degradation of the gate insulation film 14 and the like during the formation of the $SiO_2$ film 22. Thereafter, contact holes reaching the respective silicide layers 19 are formed in the $SiO_2$ film 22 and silicon oxynitride film 21 to thereby open plug contact portions. Then, after glue films 23 are formed in the contact holes, W-films are buried, for example, by a CVD method and planarized by performing CMP to thereby form W-plugs 24.

Figure 2B:
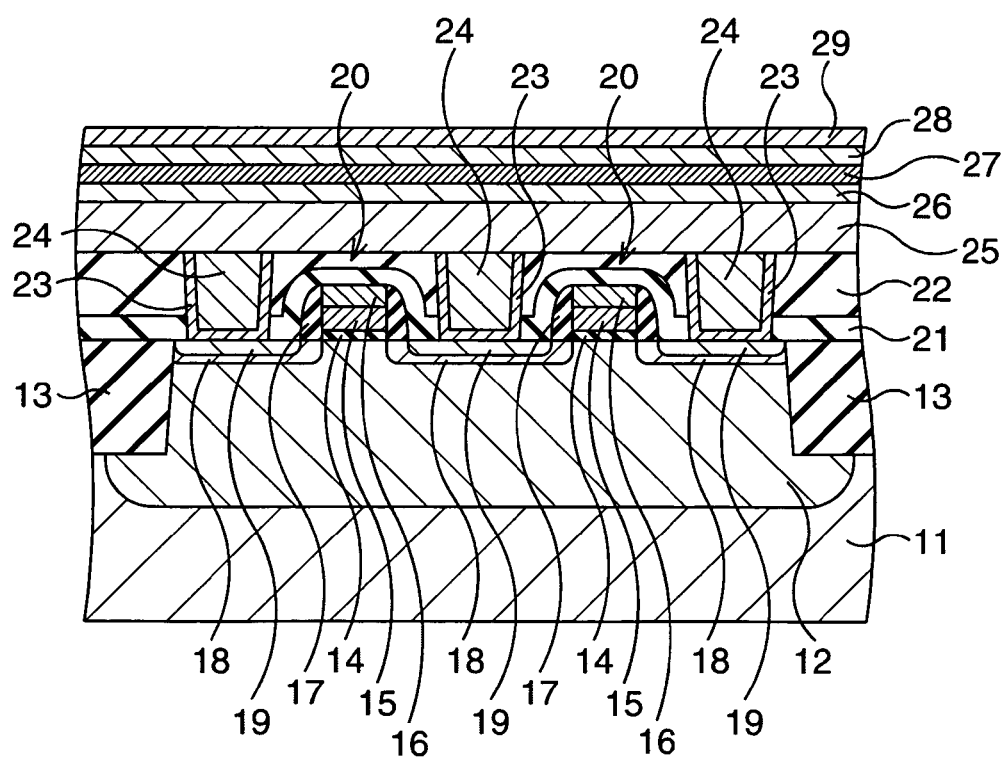

Subsequently, as shown in FIG. 2B, an Ir film 25, an $IrO_x$ film 26, a Pt film 27, a PtO film 28, and a Pt film 29 are formed in sequence by the sputtering method. For example, the thickness of the Ir film 25 is 300 nm, the thickness of the $IrO_x$ film 26 is 30 nm, and the thickness of the Pt film 27 is 15 nm. The thickness of the PtO film 28 is 25 nm and the thickness of the Pt film 29 is 50 nm. The Ir film 25 and the $IrO_x$ film 26 function as a W-oxidation barrier layer. The Pt film 27 improves the orientation of a lower electrode to be formed from the Pt film 29. The PtO film 28 functions as a diffusion barrier layer of Ir.

After the formation of the above-described layered stack, heat treatment in an Ar atmosphere is performed by RTA to improve the orientation of the Pt film 29 constituting the lower electrode.

Figure 2C:
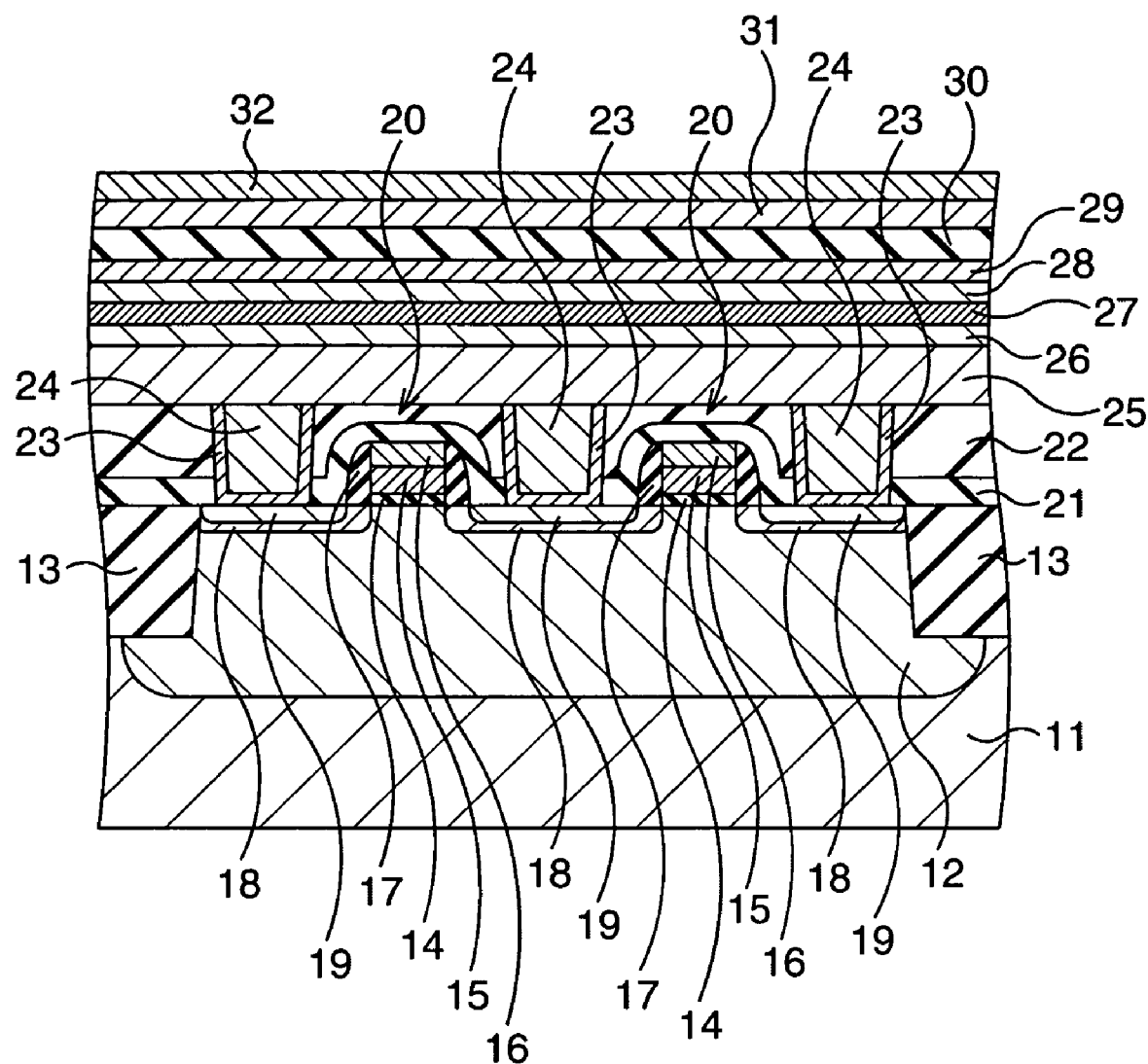

Then, as shown in FIG. 2C, a PLZT film 30 being a ferroelectric film is formed on the Pt film 29 by the sputtering method. The thickness of the PLZT film 30 is, for example, about 150 nm. The formed PLZT film 30 is in the amorphous state. Subsequently, heat treatment at 600° C. or lower is performed by the RTA method in an atmosphere containing Ar and $O_2$. As a result of this, the PLZT film 30 is crystallized and the Pt film 29 constituting the lower electrode is densified, thereby preventing mutual diffusion of platinum and oxygen in the vicinity of the boundary surface between the Pt film 29 and the PLZT film 30.

Thereafter, an $IrO_x$ film (1<x<2) 31 is formed on the PLZT film 30 by the sputtering method. The thickness of the $IrO_x$ film 31 is, for example, about 50 nm. Subsequently, heat treatment is performed by the RTA method. As a result of this, the PLZT film 30 is completely crystallized, and a very small quantity of Ir diffuses from the $IrO_x$ film 31 to the PLZT film 30, resulting in improved electric characteristics of the capacitor. Subsequently, an $IrO_2$ film 32 is further formed on the $IrO_x$ film 31 by the sputtering method. The thickness of the $IrO_2$ film 32 is, for example, about 200 nm. Next, washing of the rear surface of the semiconductor substrate 11 is performed.

Subsequently, a TiN film and a TEOS film (both not shown) are formed in sequence that are used as a hard mask in patterning of the $IrO_2$ film 32, $IrO_x$ film 31, PLZT film 30, Pt film 29, PtO film 28, Pt film 27, $IrO_x$ film 26, and Ir film 25. Thereafter, the TEOS film and TiN film are patterned to thereby form a hard mask only in regions where stack-type ferroelectric capacitors will be formed.

Figure 2D:
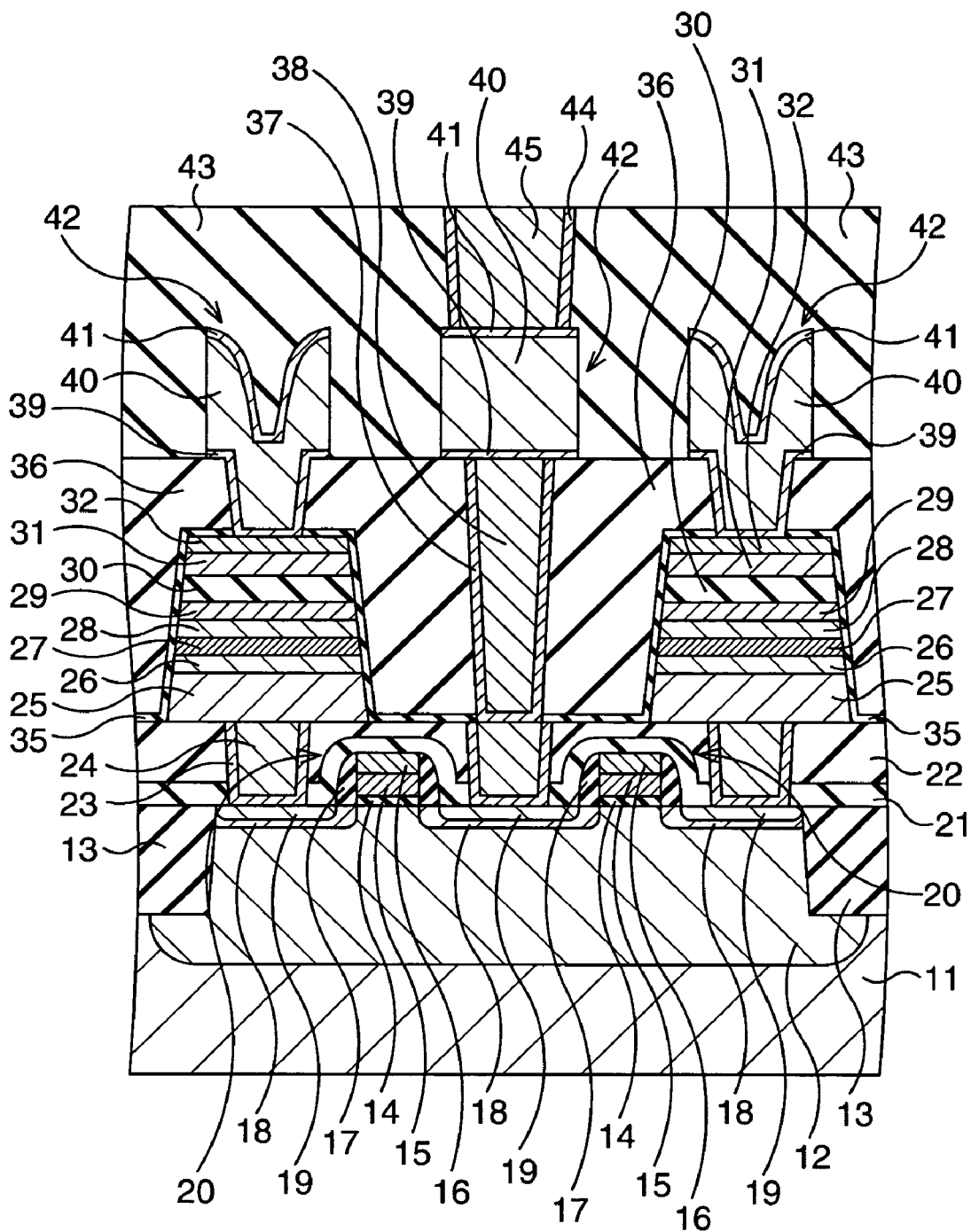

Subsequently, the $IrO_2$ film 32, $IrO_x$ film 31, PLZT film 30, Pt film 29, PtO film 28, Pt film 27, $IrO_x$ film 26, and Ir film 25 are processed at once using the patterning and etching technique using the TEOS film and TiN film as a hard mask to thereby form stack-structure ferroelectric capacitors as shown in FIG. 2D. The ferroelectric capacitors correspond to the ferroelectric capacitors 1 in FIG. 1.

Thereafter, the hard mask is removed. Next, as shown in FIG. 2D, an alumina film 35 is formed as a protective film for protecting the ferroelectric capacitors from process damage. Note that annealing is not performed from the formation of the ferroelectric capacitors to the formation of the alumina film 35 in this embodiment. The formation method of the alumina film 35 is not limited in particular. When the alumina film 35 is formed by the sputtering method, the thickness thereof is preferably, for example, 50 nm to 100 nm. Alternatively, when the alumina film 35 is formed by the MOCVD method, the thickness thereof can be, for example, 20 nm to 50 nm. This is because the MOCVD method provides better coverage.

After the formation of the alumina film 35, heat treatment at 650° C. for 60 minutes in an oxygen atmosphere is performed as recovery annealing to recover the PLZT film 30 from the damage caused during the formation of the alumina film 35. The temperature of this recovery annealing is preferably 600° C. to 750° C.

This heat treatment (recovery annealing) can recover the PLZT film 30 from all the damage that the PLZT film 30 received during the formation of the $IrO_x$ film 31, the formation of the $IrO_2$ film 32, the batch etching, and the formation of the alumina film 35. The alumina film 35 being the protective film is formed thinner on the side surface of the ferroelectric capacitor than on the top surface. Therefore, oxygen easily diffuses into the PLZT film 30 in the ferroelectric capacitor. On the other hand, as for Pb removal, since the side surface of the PLZT film 30 is covered with the alumina film 35, Pb is difficult to diffuse, which suppresses variations in the composition of the PLZT films 30 in the ferroelectric capacitors, which constitute the cell array.

After the recovery annealing, as shown in FIG. 2D, an interlayer insulation film 36 is formed on the entire surface, and the interlayer insulation film 36 is planarized by CMP. Thereafter, a contact hole reaching the W-plug 24 is formed in the interlayer insulation film 36 and alumina film 35 using the patterning and etching technique. Subsequently, a glue film 37 is formed in the contact hole, and then a W-film is buried and planarized by performing CMP to thereby form a W-plug 38. Next, a W-antioxidation insulation film (not shown) is formed on the entire surface. As the W-antioxidation insulation film, for example, a SiON film is used. Then, contact holes reaching the $IrO_2$ films 32 are formed in the W-antioxidation insulation film and interlayer insulation film 36 using the patterning the etching technique. Subsequently, annealing to recover the damage caused by the etching is performed. After the annealing, the W-antioxidation insulation film is removed by etch-back.

Next, a lower glue film 39, a wiring material film 40, and an upper glue film 41 are deposited in sequence. Then, an antireflection film (not shown) is formed on the glue film 41, and a resist film (not shown) is applied. Thereafter, the resist film is processed to match a wiring pattern, and the antireflection film, glue film 41, wiring material film 40, and glue film 39 are etched using the processed resist film as a mask. As the antireflection film, for example, a SiON film is used. By such an etching, as shown in FIG. 2D, wirings 42 can be obtained each of which is composed of the glue film 41, wiring material film 40, and glue film 39 in a predetermined plane shape.

Thereafter, formation of an interlayer insulation film 43, burying of a glue film 44 and a W-plug 45 into a contact hole, formation of wirings in a second layer from the bottom and thereafter, and so on are further performed. Then, for example, a cover film composed of a TEOS film and a SiN film is formed to complete the ferroelectric memory having the ferroelectric capacitors. It should be noted that at the time of forming an upper wiring, the wirings 42 connected to the $IrO_2$ films 32 may be connected to the plate line, and the wiring 42 connected to the source/drain diffusion layer 18 shared by the two MOS transistors 20 may be connected to the bit line. As for the gate electrode 15, the gate electrode 15 itself may be a word line or the gate electrode 15 may be connected to the word line in the upper wiring.

According to the above-described first embodiment, since the heat treatment mainly for the purpose of recovery of the PLZT film 30 performed after the formation of the ferroelectric capacitors is performed only one time, mutual diffusion between the PLZT film 30 and the upper electrode ($IrO_x$ film 31 and $IrO_2$ film 32) and the lower electrode (Pt film 29) is suppressed. Besides, comparing to the conventional method, the step on heat treatment becomes unnecessary, resulting in a reduction in the number of steps.

Second Embodiment

Next, a second embodiment of the present invention will be described. The first embodiment is made by applying the present invention to the stack-structure ferroelectric capacitor, while the second embodiment is made by applying the present invention to a planar-structure ferroelectric capacitor. FIG. 3A and FIG. 3B are cross-sectional views showing, in the order of steps, a method of manufacturing a ferroelectric memory (semiconductor device) according to the second embodiment of the present invention.

In the second embodiment, as shown in FIG. 3A, processing from the formation of the well 12 to the formation of the W-plugs 24 is performed first as in the first embodiment.

Then, a lower electrode adhesion film 64 and a Pt film 61 are formed in sequence on the entire surface. The lower electrode adhesion film 64 and Pt film 61 (lower electrode film) are formed, for example, by the sputtering method. The thickness of the lower electrode adhesion film 64 is, for example, about 20 nm. Besides, the thickness of the Pt film 61 is, for example, about 150 nm. As the lower electrode adhesion film 64, for example, a Ti film, $TiO_x$ film, $Al_2O_3$ film, or the like can be used.

Subsequently, a PLZT film 62, which is a ferroelectric film, is formed on the Pt film 61 by the sputtering method. The thickness of the PLZT film 62 is, for example, about 150 nm. The formed PLZT film 62 is in the amorphous state. Subsequently, heat treatment at 600° C. or lower is performed by the RTA method in an atmosphere containing Ar and $O_2$. As a result of this, the PLZT film 62 is crystallized and the Pt film 61 constituting the lower electrode is densified, thereby preventing mutual diffusion of platinum and oxygen in the vicinity of the boundary surface between the Pt film 61 and the PLZT film 62.

Thereafter, an $IrO_x$ film (1<x<2) 63a is formed on the PLZT film 62 by the sputtering method. The thickness of the $IrO_x$ film 63a is, for example, about 50 nm. Subsequently, heat treatment is performed by the RTA method. As a result of this, the PLZT film 62 is completely crystallized, and a very small quantity of Ir diffuses from the $IrO_x$ film 63a to the PLZT film 62, resulting in improved electric characteristics of the capacitor. Subsequently, an $IrO_2$ film 63b is further formed on the $IrO_x$ film 63a by the sputtering method. The thickness of the $IrO_2$ film 63b is, for example, about 200 nm. Next, washing of the rear surface of the semiconductor substrate 11 is performed.

Next, an upper electrode film 63 composed of the $IrO_x$ film 63a and $IrO_2$ film 63b is patterned. Subsequently, no recovery annealing being performed, the PLZT film 62 is patterned. Thereafter, no protective film such as an alumina film or the like being formed, a lower electrode film composed of the Pt film 61 and a lower electrode adhesion film 64 is patterned. In such a manner, planar-structure ferroelectric capacitors are formed as shown in FIG. 3A. The ferroelectric capacitors correspond to the ferroelectric capacitors 1 in FIG. 1.

Subsequently, as shown in FIG. 3B, an alumina film 35 is formed on the entire surface as a protective film for protecting the ferroelectric capacitors from process damage. After the formation of the alumina film 35, heat treatment at 650° C. for 60 minutes in an oxygen atmosphere is performed as recovery annealing to recover the PLZT film 62 from the damage caused during the formation of the alumina film 35. The temperature of this recovery annealing is preferably 600° C. to 700° C. Thereafter, the ferroelectric memory having the ferroelectric capacitors is completed as in the first embodiment.

In the conventional method of manufacturing the planar-structure ferroelectric capacitor, recovery annealing (heat treatment) in an oxygen atmosphere is performed between the patterning of the upper electrode film and the patterning of the ferroelectric film. The heat treatment recovers the ferroelectric film from the damage caused therein during the formation of the upper electrode. However, Pb removal from the PLZT film, which is a ferroelectric film, occurs, bringing about variations in the composition of the ferroelectric films.

Further, in the conventional manufacturing method, between the patterning of the ferroelectric film and the patterning of the lower electrode film, (1) formation of the alumina protective film to suppress hydrogen-induced degradation, (2) heat treatment in an oxygen atmosphere to suppress peeling-off of the alumina protective film, and (3) heat treatment to recover the ferroelectric film from the damage caused therein during the formation of the alumina protective film are performed. However, mutual diffusion occurs between the ferroelectric film and the upper electrode and the lower electrode during these treatments.

In contrast to that, in the above-described second embodiment, since the heat treatment mainly for the purpose of recovery of the PLZT film 62 after the formation of the ferroelectric capacitors is performed only one time, Pb removal is suppressed, and mutual diffusion between the PLZT film 62 and the upper electrode film 63 ($IrO_x$ film 63a and $IrO_2$ film 63b) and the lower electrode (Pt film 61) is suppressed.

Here, results of an experiment conducted on the second embodiment by the present inventor will be described. In this experiment, two kinds of samples, that is, Discrete and Cell Array were made and subjected to measurement of the switching charge amount Qsw, leak current, fatigue characteristics, imprint, and retention. The sample of Discrete was made for reference, and a discrete ferroelectric capacitor is often used not for a memory cell but for a logic circuit such as an RF circuit, a smoothing circuit, or the like. Further, for comparison, a sample which was made with performing recovery annealing between the patterning of the upper electrode film and the patterning of the ferroelectric film, forming a protective film between the patterning of the ferroelectric film and the patterning of the lower electrode film, and so on was also subjected to measurement of the switching charge amount Qsw and the leak current. In the sample of Discrete, the plane shape of the ferroelectric capacitor was a 50 μm×50 μm square. In the sample of Cell Array, 1280 pieces of ferroelectric capacitors each having a plane shape of a 1.13 μm×1.75 μm rectangle were arranged.

Figure 4:
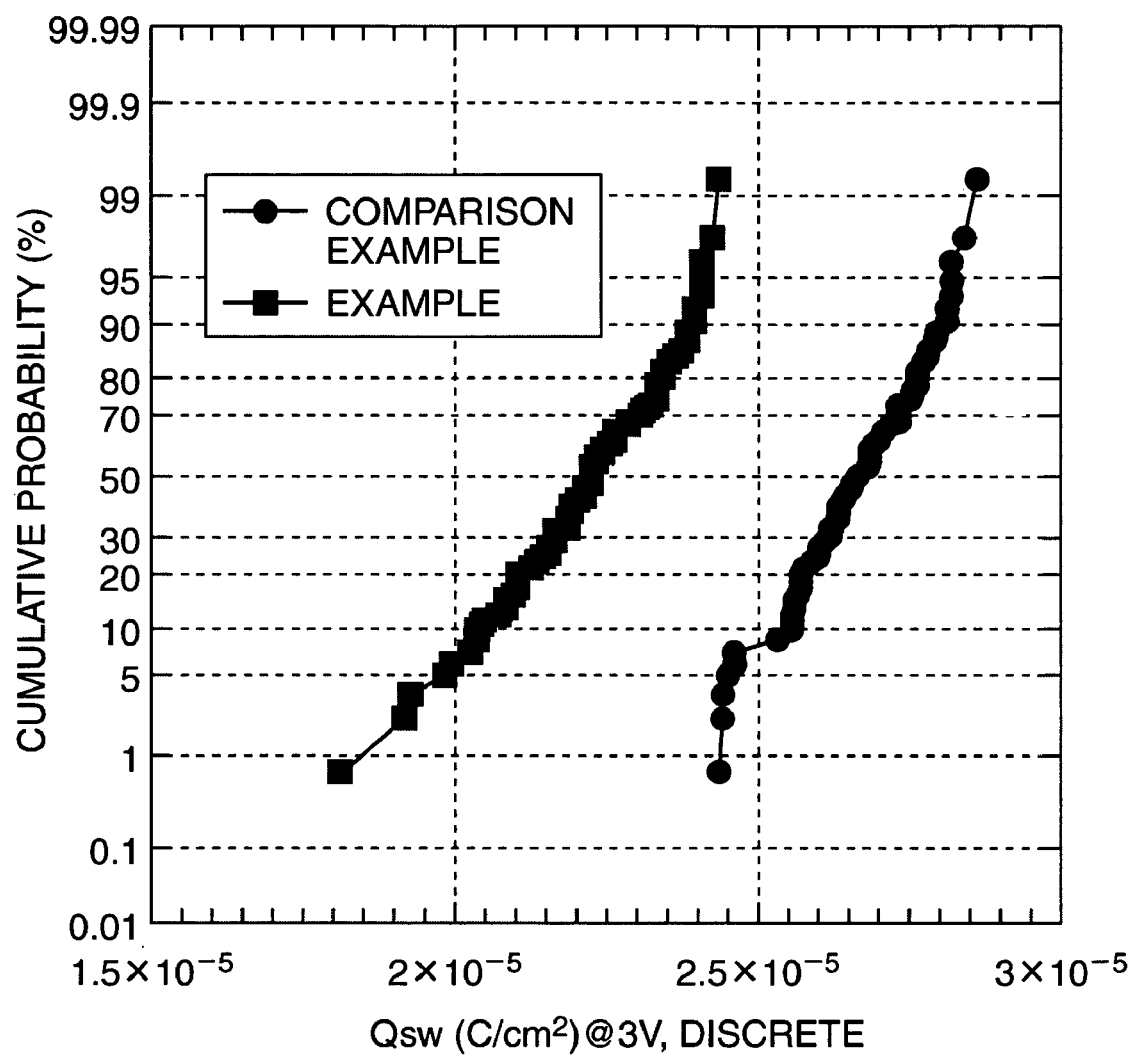
FIG. 4 is a graph showing the measurement result of the switching charge amount performed on samples of Discrete.
Figure 5:
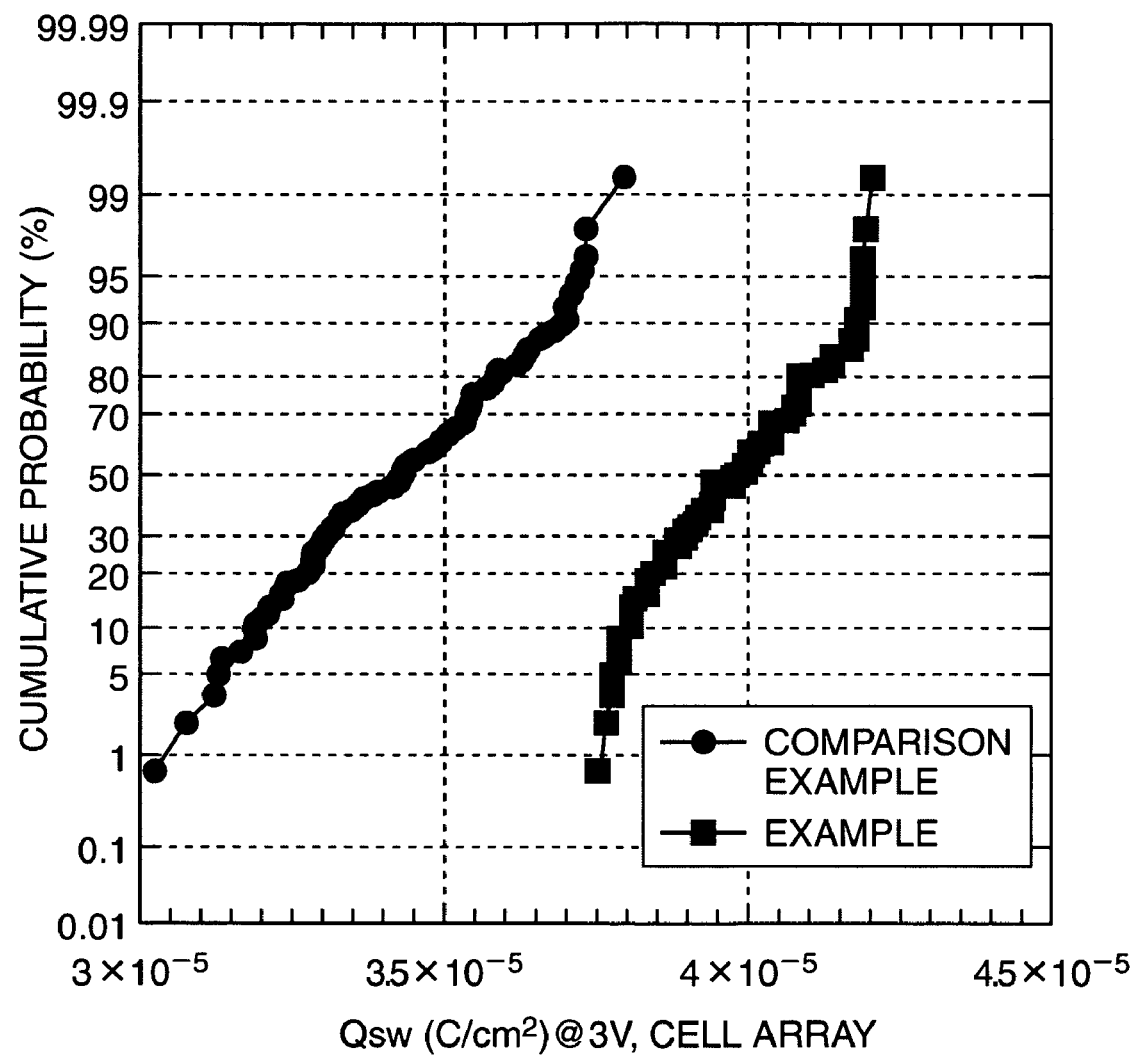
FIG. 5 is a graph showing the measurement result of the switching charge amount performed on samples of Cell Array.

FIG. 4 is a graph showing the measurement result of the switching charge amount performed on the samples of Discrete, and FIG. 5 is a graph showing the measurement result of the switching charge amount performed on the samples of Cell Array. In the measurement of the switching charge amount, a voltage of 3V was applied to the ferroelectric capacitor, and the switching charge amount was measured at 71 points within a wafer plane. As shown in FIG. 5, for Cell Array, in comparison of the example (second embodiment) with the comparison example, the switching charge amount was much higher in the example. It is conceivable that this is because the mutual diffusion between the ferroelectric film and the upper electrode film and the lower electrode film was suppressed because of the smaller number of times of recovery annealing in the example. On the other hand, as shown in FIG. 4, in the samples of Discrete, the switching charge amount was lower in the example than in the comparison example. It is conceivable that this is because the side surface of the ferroelectric film was small as compared to the sample of Cell Array and thus received less oxygen fed from the lateral direction, resulting in insufficient recovery.

Figure 6:
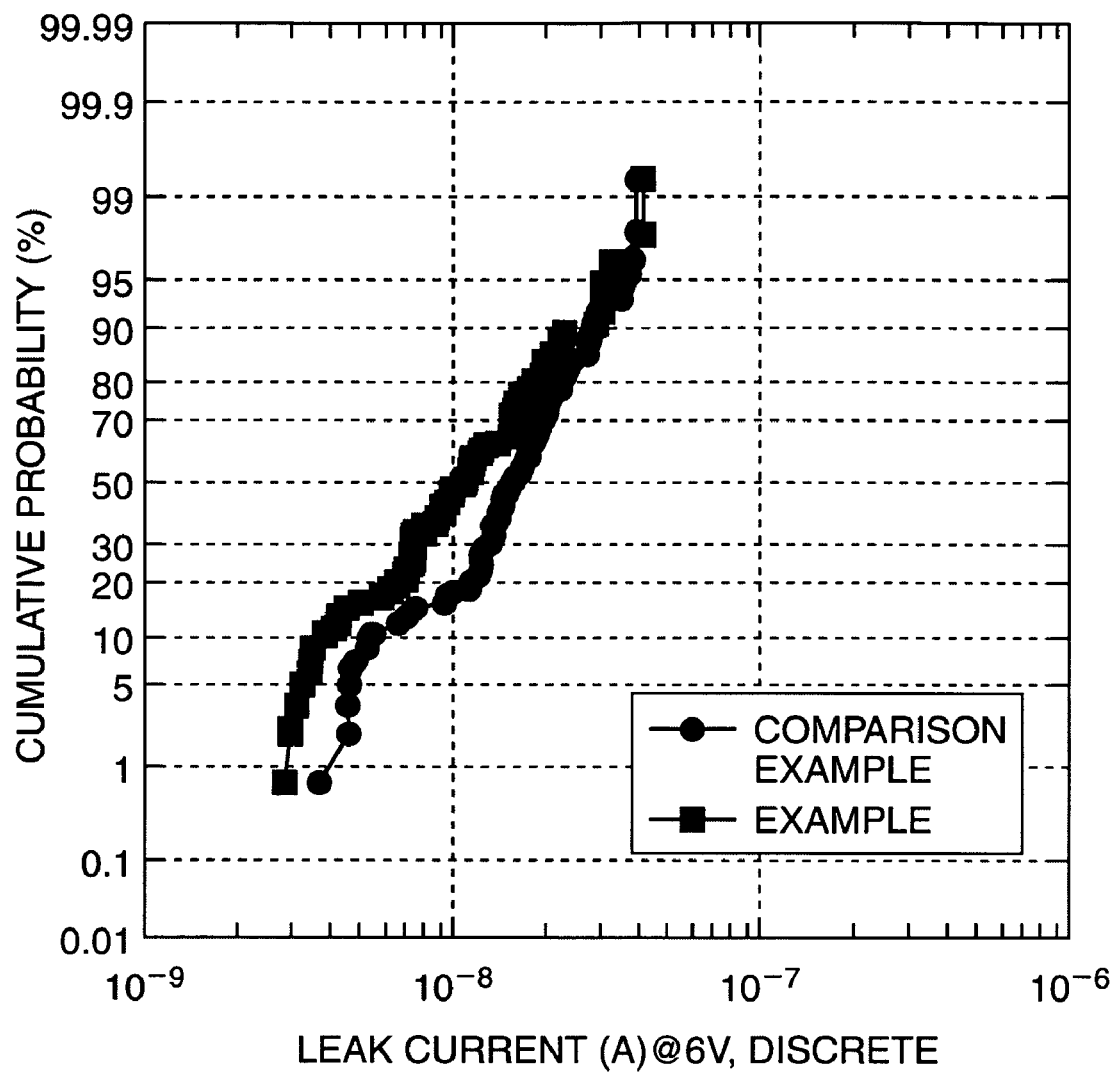
FIG. 6 is a graph showing the leak current when a voltage of 6V is applied to the samples of Discrete.
Figure 7:
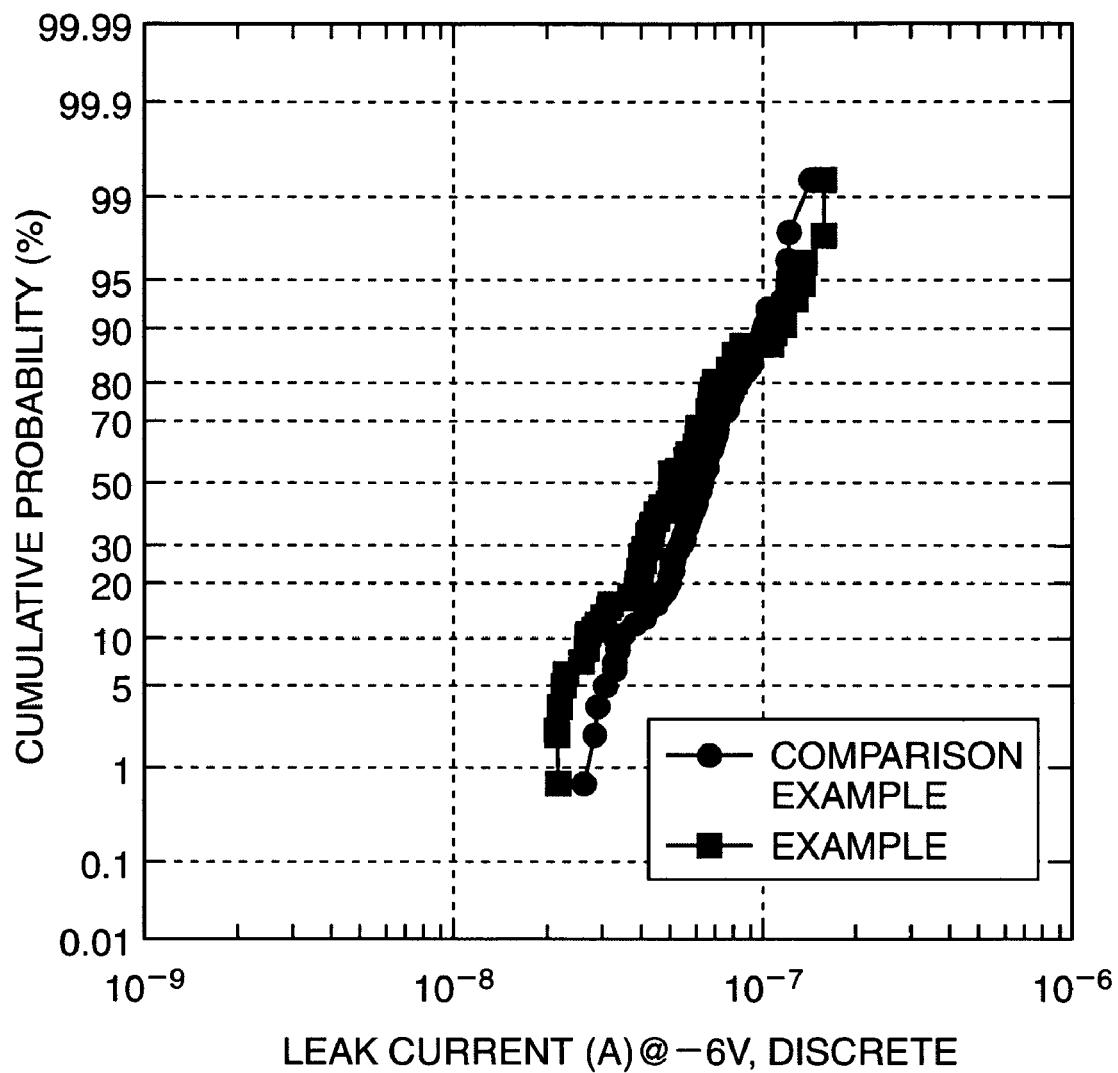
FIG. 7 is a graph showing the leak current when a voltage of −6V is applied to the samples of Discrete.
Figure 8:
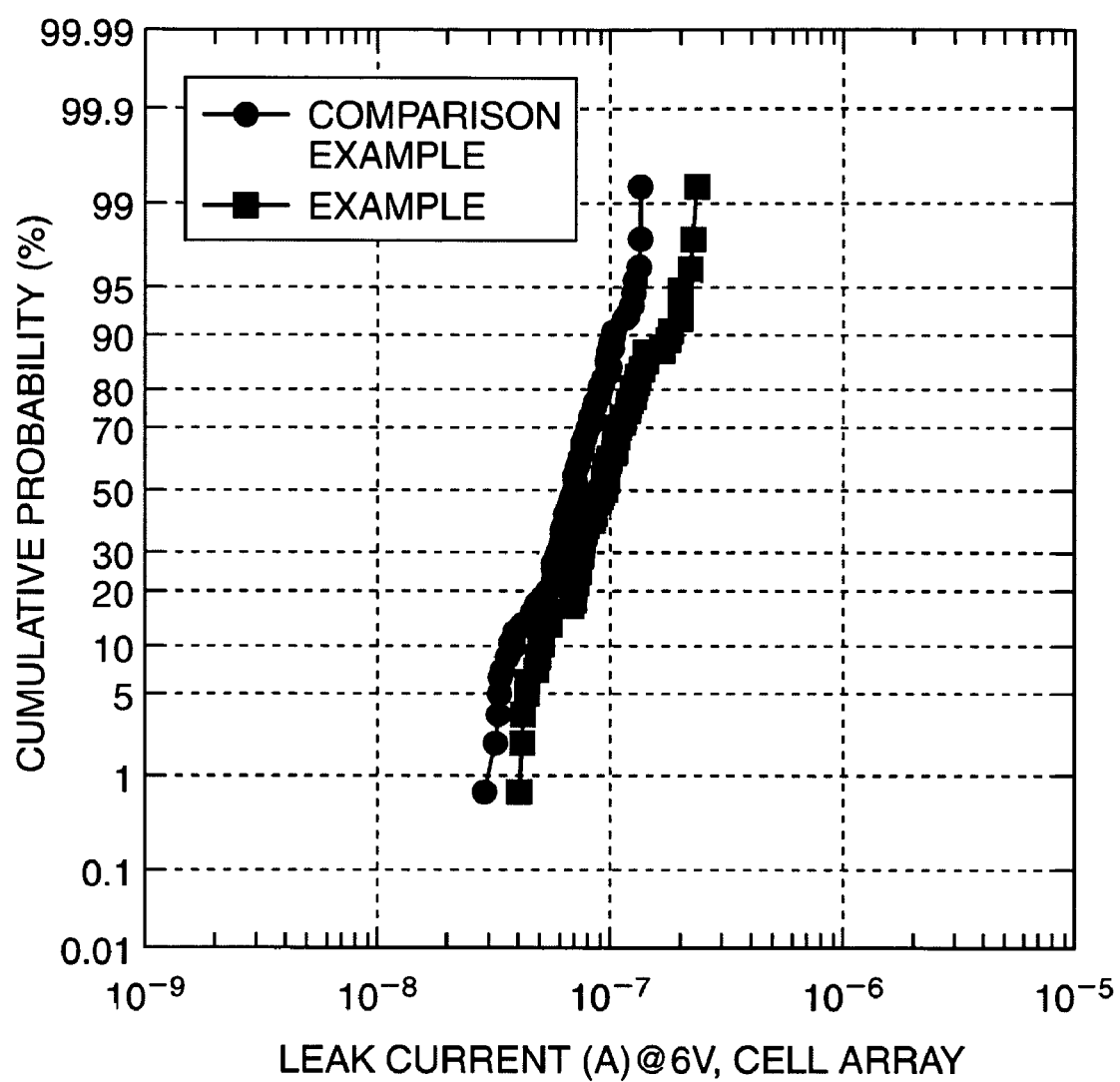
FIG. 8 is a graph showing the leak current when a voltage of 6V is applied to the samples of Cell Array.
Figure 9:
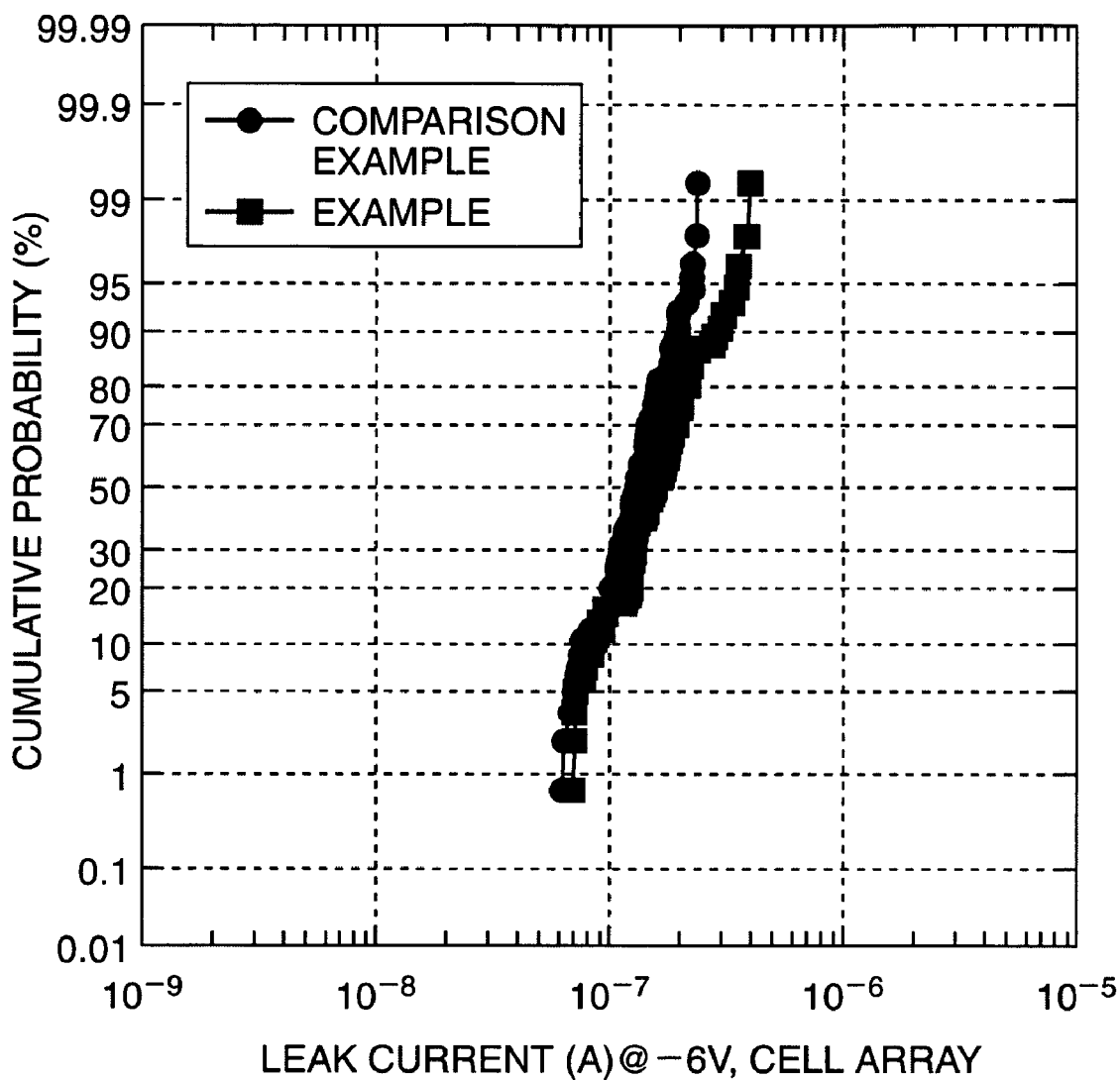
FIG. 9 is a graph showing the leak current when a voltage of −6V is applied to the samples of Cell Array.

FIG. 6 is a graph showing the leak current when a voltage of 6V is applied to the samples of Discrete, and FIG. 7 is a graph showing the leak current when a voltage of −6V is applied to the samples of Discrete. FIG. 8 is a graph showing the leak current when a voltage of 6V is applied to the samples of Cell Array, and FIG. 9 is a graph showing the leak current when a voltage of −6V is applied to the samples of Cell Array. As shown in these graphs, the leak currents in the example and comparison example were at the same level. In short, there was no increase generated in the leak current even in the example.

Figure 10:
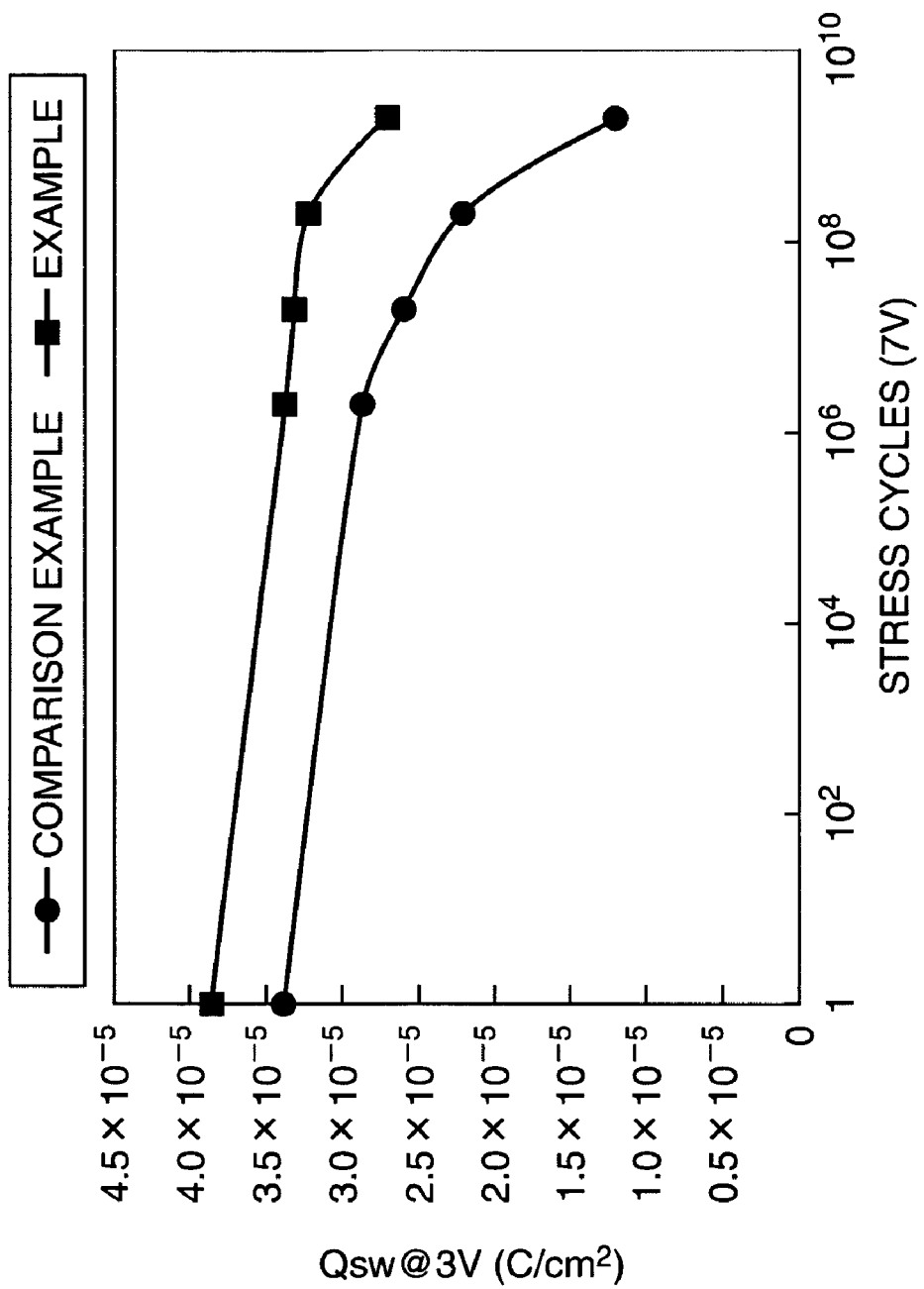
FIG. 10 is a graph showing the fatigue characteristics (change in the switching charge amount)
Figure 11:
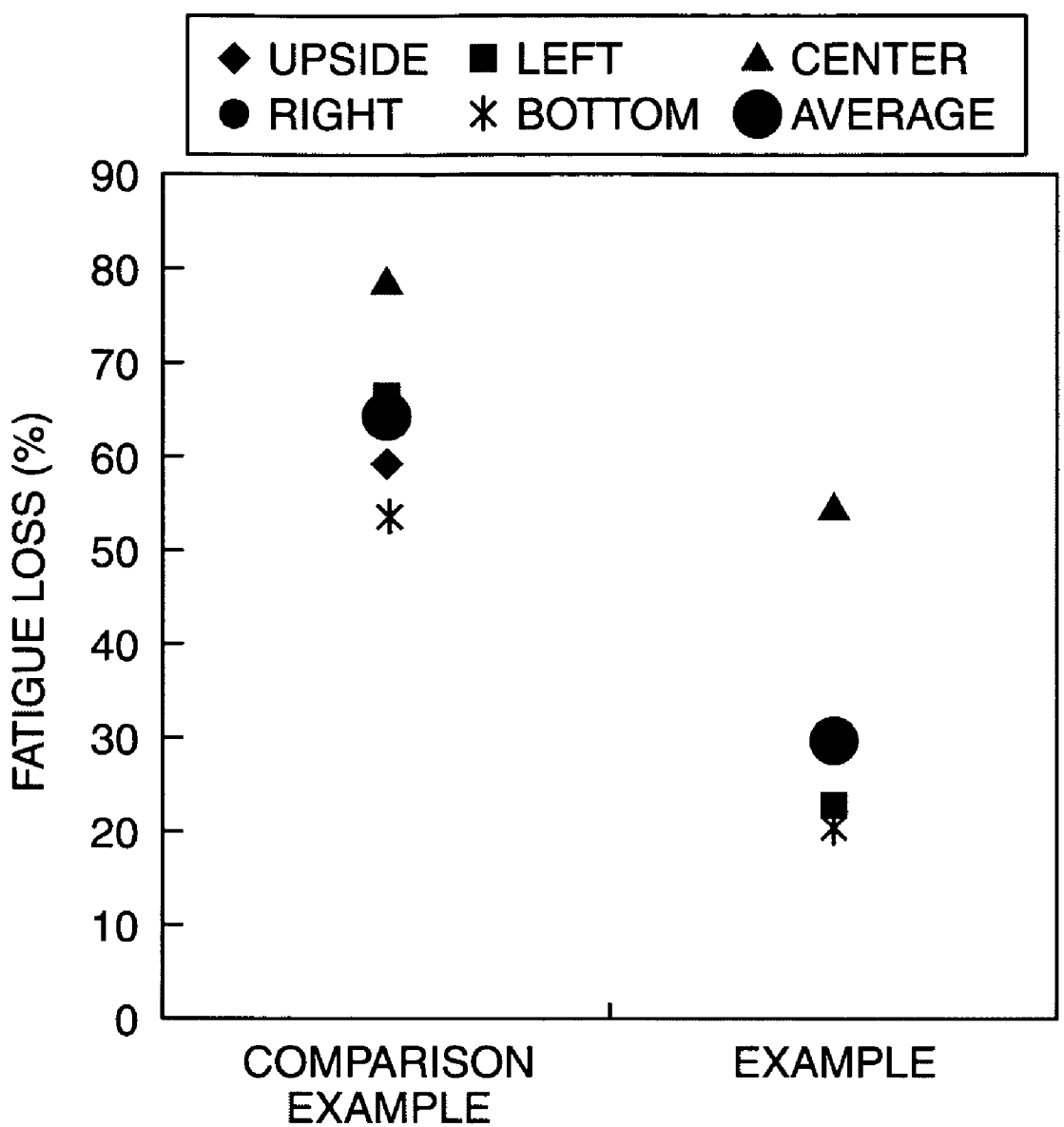
FIG. 11 is a graph showing the fatigue characteristics (fatigue loss after application of a stress of 7V, $2 \times 10^9$ times)

FIG. 10 and FIG. 11 are graphs showing the fatigue characteristics. In an experiment on the fatigue characteristics, the samples of Cell Array were used, and the switching charge amount was measured at five points within the wafer plane, with a write voltage and a read voltage of 3V, a stress voltage of 7V, and a stress cycle of $2\times10^9$ times. An average fatigue loss of about 65% in the stress cycle of $2\times10^9$ times was generated in the conventional example, whereas the average fatigue loss could be reduced to about 30% in the example. It is conceivable that this is because a large amount of Pb removal occurred during a plurality of times of recovery annealing in the conventional example, whereas the Pb removal is extremely small in amount because of only one time of recovery annealing and further the Pb concentration in the cell is relatively uniform in the example.

Figure 12:
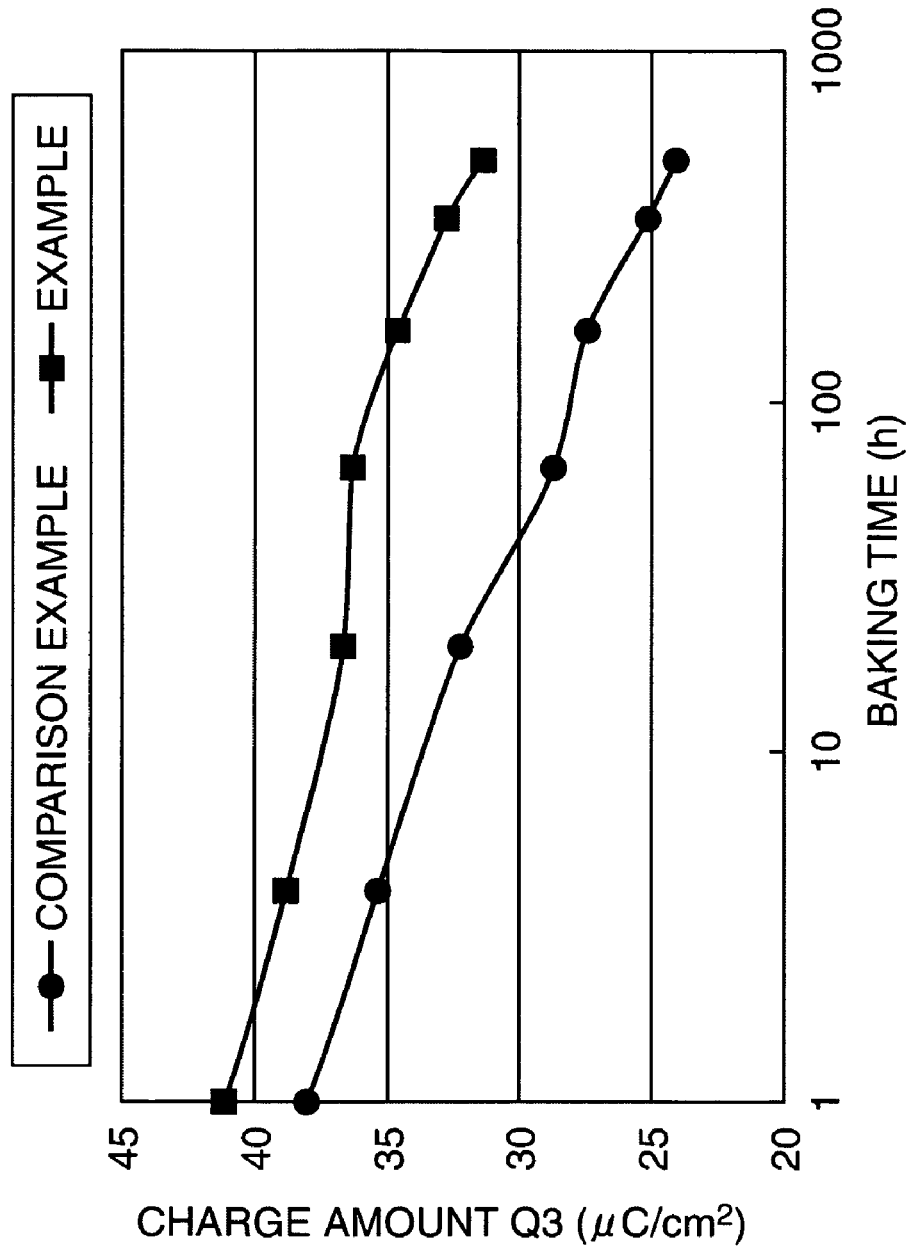
FIG. 12 is a graph showing the imprint characteristics.
Figure 13:
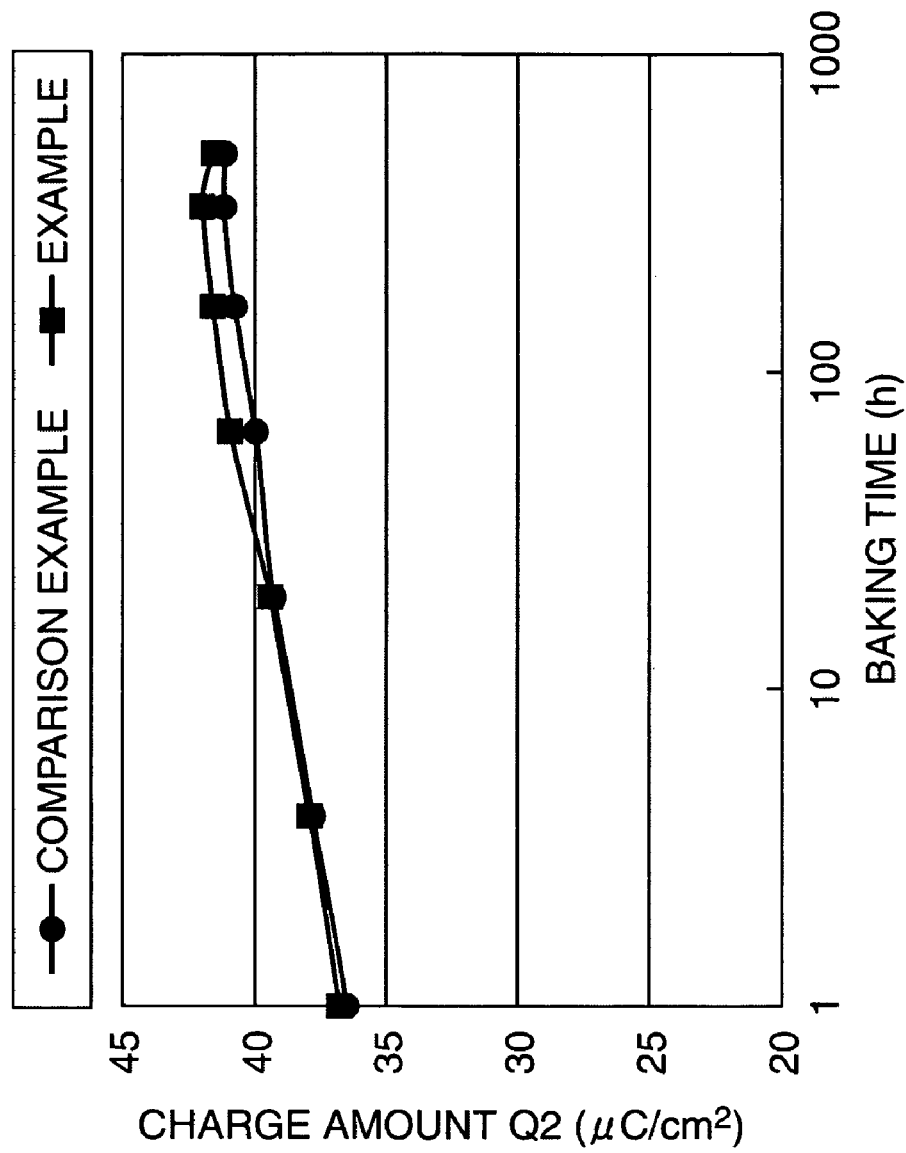
FIG. 13 is a graph showing the retention characteristics.

FIG. 12 is a graph showing the imprint characteristics, and FIG. 13 is a graph showing the retention characteristics. The imprint is a phenomenon that data written in the ferroelectric capacitor is fixed as it is and cannot be reversed. The retention is a phenomenon that the ferroelectric film of the ferroelectric capacitor is polarized in one direction, and thereafter the amount of polarization decreases with passage of time. In this measurement, the samples of Cell Array were used, in each of which one of two ferroelectric capacitors was first polarized in the positive directions and the other was polarized in the negative direction. Thereafter, they were left at 150° C., and the amount of retaining the polarization (charge amount Q2) and the value of the polarization after reverse of the polarization (charge amount Q3) were measured every lapse of a predetermined period.

As shown in FIG. 12, on the imprint characteristics, the charge amount Q3 being higher in the example, a charge amount Q3 as high as 32 ($\mu C/cm^2$) left in the example after the samples were left at 150° C. for 490 hours, whereas the charge amount Q3 was as low as 24 ($\mu C/cm^2$) in the conventional example. Besides, the imprint rate after a lapse of 490 hours was −5.90% in the conventional example, whereas it was −3.44% in the example. On the other hand, on the retention characteristics, as shown in FIG. 13, there was no big difference occurred between the conventional example and the example until a lapse of 20 hours, but the charge mount Q2 was higher in the example after the lapse of 20 hours, resulting in a slight low retention characteristic of polarization in the conventional example. From these results, it can be said that according to the example, in the sample of Cell Array, the composition of the ferroelectric films became more uniform, and excessive diffusion of Ir from the upper electrode film to the ferroelectric film was suppressed, resulting in prevention of occurrence of imprint.

Note that it is also possible to use as the ferroelectric film a PZT film or the like in addition to the PLZT film.

According to the present invention, it is possible to sufficiently recover the ferroelectric film from the damage caused during the formation of the ferroelectric capacitor and the formation of the aluminum oxide film while suppressing removal and mutual diffusion between the ferroelectric film and the upper electrode and the lower electrode of constituent elements of the ferroelectric film. Therefore, variations in composition of the ferroelectric films can be suppressed, and mutual diffusion can also be suppressed. As a result of these, it is possible to improve the switching charge amount, greatly reduce the fatigue loss, and prevent occurrence of imprint. Further, no heat treatment, which has been performed in the prior art, is performed, so that the number of steps can be reduced.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A method of manufacturing a semiconductor device, comprising the steps of:

forming a lower electrode film;

forming a ferroelectric film on the lower electrode film;

forming a first upper electrode film on the ferroelectric film;

performing first annealing to crystallize the ferroelectric film after forming the first upper electrode film;

forming a second upper electrode film on the first upper electrode film after performing said first annealing to crystallize the ferroelectric film;

patterning the second upper electrode film, the first upper electrode film, the crystallized ferroelectric film, and the lower electrode film to form a patterned ferroelectric capacitor;

forming an aluminum oxide film covering all of the upper surface and the side surface of the patterned ferroelectric capacitor; and performing second annealing of the crystallized ferroelectric film in an oxidizing gas atmosphere after forming the aluminum oxide film, wherein no heat treatment is performed between said step of forming the second upper electrode film and said step of performing the second annealing of the crystallized ferroelectric film.

2. The method of manufacturing a semiconductor device according to claim 1, wherein the oxidizing gas atmosphere is an atmosphere containing oxygen.

3. The method of manufacturing a semiconductor device according to claim 1, wherein the annealing of the crystallized ferroelectric film is performed at 600° C. to 750° C.

4. The method of manufacturing a semiconductor device according to claim 1, wherein the aluminum oxide film is formed by a sputtering method or an MOCVD method.

5. The method of manufacturing a semiconductor device according to claim 4, wherein when the aluminum oxide film is formed by the sputtering method, a thickness thereof is 50 nm to 100 nm.

6. The method of manufacturing a semiconductor device according to claim 4, wherein when the aluminum oxide film is formed by the MOCVD method, a thickness thereof is 20 nm to 50 nm.

7. The method of manufacturing a semiconductor device according to claim 1, wherein the upper electrode film, the ferroelectric film, and the lower electrode film are patterned at once.

8. The method of manufacturing a semiconductor device according to claim 1, wherein the upper electrode film, the ferroelectric film, and the lower electrode film are patterned in sequence.

9. The method of manufacturing a semiconductor device according to claim 1, wherein as the ferroelectric film, a film is formed which is to have a crystal structure of a bismuth layer structure or a perovskile structure by heat treatment.

10. The method of manufacturing a semiconductor device according to claim 1, wherein the ferroelectric film is formed by a sol-gel method, a sputtering method, or an MOCVD method.

11. The method of manufacturing a semiconductor device according to claim 1, wherein in said step of crystallizing the ferroelectric film, heat treatment at 600° C. or lower is performed in an atmosphere containing oxygen.

12. The method of manufacturing a semiconductor device according to claim 1, wherein the upper electrode contains a noble metal oxide.

13. The method of manufacturing a semiconductor device according to claim 12, wherein the upper electrode has one or more noble metal oxide films.

14. The method of manufacturing a semiconductor device according to claim 1, wherein the lower electrode contains a noble metal or a noble metal oxide.

15. The method of manufacturing a semiconductor device according to claim 14, wherein the lower electrode has one or more noble metal films or noble metal oxide films.

16. The method of manufacturing a semiconductor device according to claim 1, wherein the ferroelectric capacitor is formed for each memory cell.

17. The method of manufacturing a semiconductor device according to claim 1, wherein said ferroelectric film is formed in an amorphous state in said step of forming the ferroelectric film on the lower electrode film.

18. A method of manufacturing a semiconductor device, comprising the steps of:

forming a lower electrode film;

forming a ferroelectric film on the lower electrode film;

forming a first upper electrode film including $IrO_x$ on the ferroelectric film;

performing first annealing to crystallize the ferroelectric film after forming the first upper electrode film;

forming a second upper electrode film including $IrO_y$, (y>x) on the first upper electrode film after performing said first annealing to crystallize the ferroelectric film;

patterning the second upper electrode film, the first upper electrode film, the crystallized ferroelectric film, and the lower electrode film to form a patterned ferroelectric capacitor;

forming an aluminum oxide film covering all of the upper surface and the side surface of the patterned ferroelectric capacitor; and performing second annealing of the crystallized ferroelectric film in an oxidizing gas atmosphere after forming the aluminum oxide film.

19. A method of manufacturing a semiconductor device, comprising the steps of:

forming a tower electrode film;

forming a ferroelectric film on the lower electrode film;

forming a first upper electrode film on the ferroelectric film;

performing first annealing to crystallize the ferroelectric film after forming the first upper electrode film;

forming a second upper electrode film on the first upper electrode film after performing said first annealing to crystallize the ferroelectric film;

patterning the second upper electrode film, the first upper electrode film, the crystallized ferroelectric film, and the lower electrode film to form a patterned ferroelectric capacitor;

forming an aluminum oxide film covering all of the upper surface and the side surface of the patterned ferroelectric capacitor; and performing second annealing of the crystallized ferroelectric film in an oxidizing gas atmosphere after forming the aluminum oxide film, wherein a heat treatment at 600° C. or more is not performed between said step of forming the second upper electrode film and said step of performing the second annealing of the crystallized ferroelectric film.

* * * * *

UNITED STATES PATENT AND TRADEMARK OFFICE
CERTIFICATE OF CORRECTION

| | | |
|---|---|---|
| PATENT NO. | : 7,368,298 B2 | Page 1 of 1 |
| APPLICATION NO. | : 10/835436 | |
| DATED | : May 6, 2008 | |
| INVENTOR(S) | : Wensheng Wang | |

It is certified that error appears in the above-identified patent and that said Letters Patent is hereby corrected as shown below:

On the Title Page:

In Item 54 change "METHOD OF MANUFACTURING FERROELECTRIC SEMICONDUCTOR DEVICE" to be --METHOD OF MANUFACTURING SEMICONDUCTOR DEVICE--

Signed and Sealed this

Seventeenth Day of February, 2009

JOHN DOLL
*Acting Director of the United States Patent and Trademark Office*

UNITED STATES PATENT AND TRADEMARK OFFICE
CERTIFICATE OF CORRECTION

PATENT NO.         : 7,368,298 B2
APPLICATION NO.    : 10/835436
DATED              : May 6, 2008
INVENTOR(S)        : Wensheng Wang Page 1 of 1

It is certified that error appears in the above-identified patent and that said Letters Patent is hereby corrected as shown below:

On the Title Page, Item (54) and Column 1, lines 1-3

Change "METHOD OF MANUFACTURING FERROELECTRIC SEMICONDUCTOR DEVICE" to be --METHOD OF MANUFACTURING SEMICONDUCTOR DEVICE--

This certificate supersedes the Certificate of Correction issued February 17, 2009.

Signed and Sealed this

Seventeenth Day of March, 2009

JOHN DOLL
*Acting Director of the United States Patent and Trademark Office*